United States Patent
Kim et al.

(10) Patent No.: US 10,915,015 B2
(45) Date of Patent: Feb. 9, 2021

(54) EUV MASK BLANK, PHOTOMASK MANUFACTURED BY USING THE EUV MASK BLANK, LITHOGRAPHY APPARATUS USING THE PHOTOMASK AND METHOD OF FABRICATING SEMICONDUCTOR DEVICE USING THE PHOTOMASK

(71) Applicant: Samsung Electronics Co., Ltd., Suwon-si (KR)

(72) Inventors: Ho Yeon Kim, Seoul (KR); Seong Chul Hong, Suwon-si (KR); Seong Sue Kim, Seoul (KR)

(73) Assignee: Samsung Electronics Co., Ltd.

( * ) Notice: Subject to any disclaimer, the term of this patent is extended or adjusted under 35 U.S.C. 154(b) by 156 days.

(21) Appl. No.: 16/225,915

(22) Filed: Dec. 19, 2018

(65) Prior Publication Data

US 2019/0196321 A1   Jun. 27, 2019

(30) Foreign Application Priority Data

Dec. 21, 2017   (KR) .................. 10-2017-0176846

(51) Int. Cl.
| | | |
|---|---|---|
| *G03F 1/22* | (2012.01) | |
| *G03F 1/58* | (2012.01) | |
| *G03F 1/24* | (2012.01) | |
| *G03F 1/52* | (2012.01) | |
| *G03F 1/54* | (2012.01) | |
| *H01L 21/027* | (2006.01) | |

(52) U.S. Cl.
CPC .................. *G03F 1/22* (2013.01); *G03F 1/24* (2013.01); *G03F 1/52* (2013.01); *G03F 1/54* (2013.01); *G03F 1/58* (2013.01); *H01L 21/027* (2013.01)

(58) Field of Classification Search
CPC ..... G03F 1/22; G03F 1/24; G03F 1/52; G03F 1/54; G03F 1/58
See application file for complete search history.

(56) References Cited

U.S. PATENT DOCUMENTS

| | | |
|---|---|---|
| 7,771,895 B2 | 8/2010 | Wu et al. |
| 8,828,626 B2 | 9/2014 | Mikami et al. |
| 8,993,201 B2 | 3/2015 | Mikami et al. |

(Continued)

FOREIGN PATENT DOCUMENTS

| | | |
|---|---|---|
| JP | 2016063020 | 4/2016 |
| JP | 2016122684 | 7/2016 |

(Continued)

OTHER PUBLICATIONS

Search Report and Written Opinion for corresponding Singaporean Application No. 10201807467Q (9 pages) (dated May 28, 2019).

*Primary Examiner* — Stewart A Fraser
(74) *Attorney, Agent, or Firm* — Myers Bigel, P.A.

(57) ABSTRACT

An extreme ultraviolet (EUV) mask blank is provided. The EUV mask blank includes a substrate having a first surface and a second surface opposed to each other, a reflective layer having first reflective layers and second reflective layers alternately stacked on the first surface of the substrate, a capping layer on the reflective layer, and a hydrogen absorber layer between the reflective layer and the capping layer, the hydrogen absorber layer configured to store hydrogen and being in contact with the capping layer.

20 Claims, 10 Drawing Sheets

(56) References Cited

U.S. PATENT DOCUMENTS

| | | |
|---|---|---|
| 9,581,890 B2 | 2/2017 | Hofmann et al. |
| 2003/0008180 A1 | 1/2003 | Bajt et al. |
| 2005/0026046 A1 | 2/2005 | Yan |
| 2012/0225375 A1 | 9/2012 | Mikami |
| 2013/0115547 A1 | 5/2013 | Mikami et al. |
| 2015/0010854 A1 | 1/2015 | Seo et al. |
| 2016/0147139 A1* | 5/2016 | Onoue ................. G03F 1/24 430/5 |
| 2017/0263444 A1 | 9/2017 | Shoki et al. |

FOREIGN PATENT DOCUMENTS

| | | |
|---|---|---|
| WO | 2012/175494 | 12/2012 |
| WO | 2014139694 | 9/2014 |
| WO | 2016043147 | 3/2016 |
| WO | 2016104239 | 6/2016 |

* cited by examiner

EUV MASK BLANK, PHOTOMASK MANUFACTURED BY USING THE EUV MASK BLANK, LITHOGRAPHY APPARATUS USING THE PHOTOMASK AND METHOD OF FABRICATING SEMICONDUCTOR DEVICE USING THE PHOTOMASK

CROSS-REFERENCE TO RELATED APPLICATION

This application claims priority from Korean Patent Application No. 10-2017-0176846 filed on Dec. 21, 2017 in the Korean Intellectual Property Office, and all the benefits accruing therefrom under 35 U.S.C. 119, the contents of which are incorporated by reference herein in its entirety.

BACKGROUND

The present disclosure relates to semiconductor device fabrication, and more particularly, to extreme ultraviolet (EUV) mask blanks and associated photomasks, lithography apparatus, and methods of fabricating semiconductor devices.

With the rapid development of information media, the functions of semiconductor devices have been dramatically developed. In order to be competitive, high integration of low-cost, high-quality semiconductor devices may be required. For high integration, the spacing between the patterns of semiconductor devices may be gradually decreased. A photolithography process using an ArF excimer laser as a light source may have limitations in realizing a line width of 32 nm or less. In order to realize a line width of 32 nm or less, immersion photolithography, double patterning and the like have been introduced, each with their own limitations.

In order to address the above and other problems, a photolithography apparatus using extreme ultraviolet (EUV) light as a light source has been introduced. However, extreme ultraviolet light may be greatly attenuated by the atmosphere and may be absorbed by many materials, and may be incompatible with a transmissive photomask used in an ArF photolithography process. Therefore, a photomask including a reflective layer is typically used in an extreme ultraviolet photolithography process.

SUMMARY

Aspects of the present disclosure provide an extreme ultraviolet (EUV) mask blank including a hydrogen absorber layer capable of storing and/or dissolving hydrogen.

Aspects of the present disclosure also provide a photomask which can be used in an EUV lithography process and includes a hydrogen absorber layer capable of storing and/or dissolving hydrogen.

Aspects of the present disclosure also provide a lithography apparatus in which a photomask including a hydrogen absorber layer can be used.

Aspects of the present disclosure also provide a method of fabricating a semiconductor device using a photomask including a hydrogen absorber layer.

According to embodiments of the present disclosure, an extreme ultraviolet (EUV) mask blank comprises: a substrate including a first surface and a second surface opposed to each other; a reflective layer including first reflective layers and second reflective layers alternately stacked on the first surface of the substrate; a capping layer on the reflective layer; and a hydrogen absorber layer between the reflective layer and the capping layer, the hydrogen absorber layer configured to store hydrogen and being in contact with the capping layer.

According to embodiments of the present disclosure, an extreme ultraviolet (EUV) mask blank comprises: a low thermal expansion material (LTEM) substrate including a first surface and a second surface opposed to each other; a reflective layer including a molybdenum (Mo)/silicon (Si) periodic multilayer on the first surface of the LTEM substrate; a first absorber layer on the reflective layer, the first absorber layer being formed of transition metal and including at least one of titanium (Ti), vanadium (V), manganese (Mn), iron (Fe), cobalt (Co), nickel (Ni), copper (Cu), zirconium (Zr), molybdenum (Mo), palladium (Pd), hafnium (Hf), tantalum (Ta), rhodium (Rh), or gold (Au); a capping layer on the first absorber layer, the capping layer being formed of one of ruthenium (Ru) and a ruthenium compound; and a second absorber layer on the capping layer opposite the first absorber layer.

According to embodiments of the present disclosure, a photomask comprises: a substrate including a first surface and a second surface opposed to each other; a reflective layer, which is a molybdenum (Mo)/silicon (Si) periodic multilayer, on the first surface of the substrate; a capping layer on the reflective layer; a hydrogen absorber layer between the reflective layer and the capping layer, the hydrogen absorber layer configured to store hydrogen and being in contact with the capping layer; a light absorption pattern on the capping layer, the light absorption pattern including an opening for passing extreme ultraviolet light therethrough; and a conductive coating film on the second surface of the substrate.

According to embodiments of the present disclosure, a method of fabricating a semiconductor device, comprises: forming a mask film on a substrate; and etching the mask film using a photolithography process using a photomask to form a mask pattern on the substrate, wherein the photomask includes: a mask substrate including a first surface and a second surface opposed to each other; a reflective layer, which is a molybdenum (Mo)/silicon (Si) periodic multilayer, on the first surface of the mask substrate; a capping layer on the reflective layer; a hydrogen absorber layer between the reflective layer and the capping layer, the hydrogen absorber layer configured to store hydrogen and being in contact with the capping layer; a light absorption pattern on the capping layer, the light absorption pattern including an opening for passing extreme ultraviolet light therethrough; and a conductive coating film on the second surface of the mask substrate.

According to embodiments of the present disclosure, a lithography apparatus, comprises: a source configured to provide exposure light; a first sub-chamber in which at least one illumination system reflection mirror that is configured to reflect the exposure light is disposed; a stage module including a photomask that is configured to reflect the exposure light having passed through the first sub-chamber; a second sub-chamber in which at least one projection optical system reflection mirror that is configured to project the reflected exposure light onto a wafer is disposed; and a wafer stage that is configured to support the wafer, wherein the photomask includes: a mask substrate including a first surface and a second surface opposed to each other; a reflective layer, which is a molybdenum (Mo)/silicon (Si) periodic multilayer, on the first surface of the mask substrate; a capping layer on the reflective layer; a hydrogen absorber layer between the reflective layer and the capping layer, the hydrogen absorber layer configured to store hydrogen and being in contact with the capping layer; a light absorption pattern on the capping layer, the light absorption pattern including an opening for passing extreme ultraviolet light therethrough; and a conductive coating film on the second surface of the mask substrate.

However, aspects of the present disclosure are not restricted to those set forth herein. The above and other aspects of the present disclosure will become more apparent to one of ordinary skill in the art to which the present disclosure pertains by referencing the detailed description below.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

Some elements shown in the present specification may be exaggerated or reduced to facilitate understanding. That is, some drawings may be drawings which are not to scale.

Figure 1:
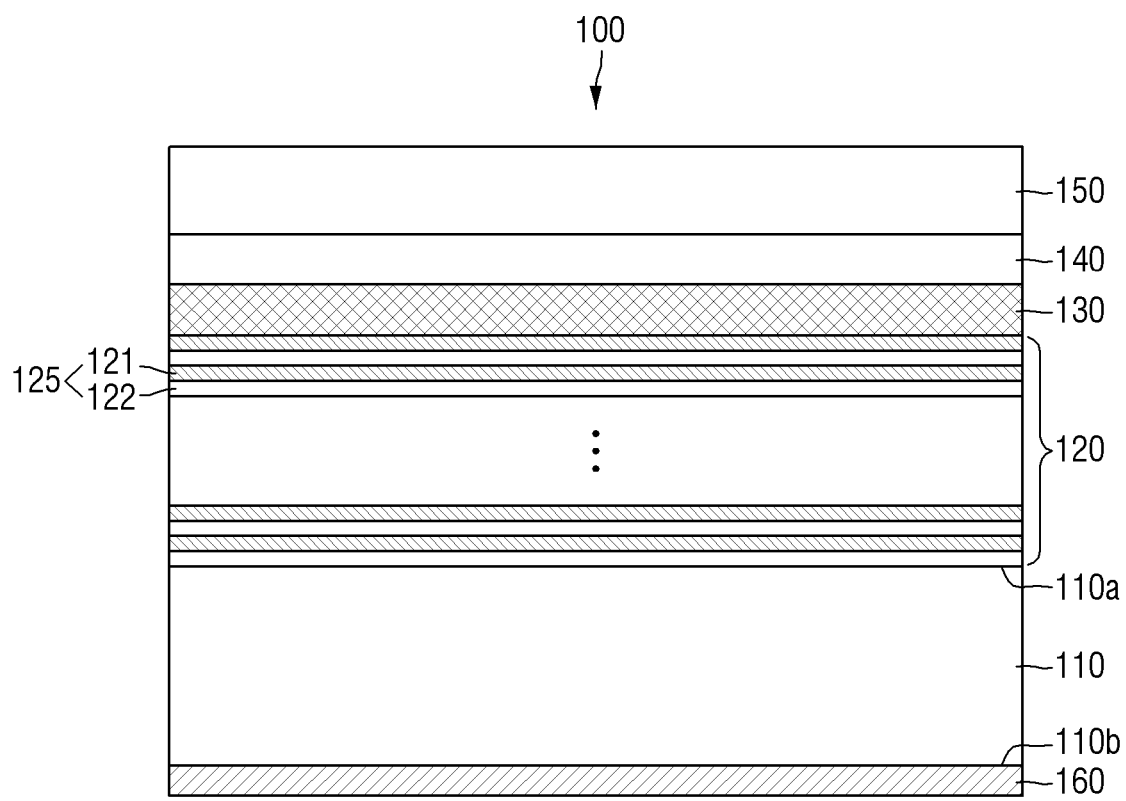
FIG. 1 is a diagram illustrating an extreme ultraviolet (EUV) mask blank according to some embodiments of the present disclosure.

FIG. 1 is a diagram illustrating an extreme ultraviolet (EUV) mask blank according to some embodiments of the present disclosure. For example, the extreme ultraviolet mask blank 100 may be a substrate for manufacturing a photomask that can be mounted in a photolithography apparatus using extreme ultraviolet light as a light source.

Referring to FIG. 1, an EUV mask blank 100 according to some embodiments of the present disclosure includes a mask substrate 110, a reflective layer 120, a hydrogen absorber layer 130, a capping layer 140, a light absorber layer 150 and a conductive coating film 160.

The mask substrate 110 may be made of a dielectric, glass, a semiconductor, or a metal material. In some embodiments, the mask substrate 110 may be made of a material having a low thermal expansion coefficient. For example, the mask substrate 110 may have a thermal expansion coefficient of $0\pm1.0\times10^{-7}/°$ C. at 20° C.

Further, the mask substrate 110 may be made of a material having a desired smoothness, flatness, and/or resistance to a cleaning solution. The term "and/or" includes any and all combinations of one or more of the associated listed items. For example, the mask substrate 110 may be made of synthetic quartz glass, quartz glass, aluminosilicate glass, soda lime glass, low thermal expansion material (LTEM) glass such as $SiO_2$—$TiO_2$-based glass (binary ($SiO_2$—$TiO_2$) or ternary ($SiO_2$—$TiO_2$—$SnO_2$)), crystallized glass obtained by precipitating a β-quartz solid solution, single crystal silicon, or SiC. The mask substrate 110 included in the EUV mask blank may be required to have low thermal expansion characteristics. Thus, in some embodiments, the mask substrate 110 may be made of, for example, a multi-component glass material.

The mask substrate 110 may include a first surface 110a and a second surface 110b which are opposed to each other. For example, the first surface 110a of the mask substrate 110 may have a flatness of about 50 nm or less. The second surface 110b of the mask substrate 110 may have a flatness of about 500 nm or less. Each of the first surface 110a and the second surface 110b of the mask substrate 110 may have a root mean square (RMS) surface roughness of about 0.15 nm or less, but the present disclosure is not limited thereto. As used herein, the terms first, second, third, etc. are used merely to differentiate one direction, region, portion, or element from another.

The reflective layer 120 may be disposed on the first surface 110a of the mask substrate 110. The reflective layer 120 may reflect extreme ultraviolet (EUV) light. The reflective layer 120 may have a multilayer mirror structure. The reflective layer 120 may have material layers having a high refractive index and material layers having a low refractive index, which are alternately stacked a plurality of times.

The reflective layer 120 may include first reflective layers 121 and second reflective layers 122 which are alternately stacked. The reflective layer 120 may include a periodic multilayer including the first reflective layers 121 and the second reflective layers 122. The reflective layer 120 may include the first reflective layers 121 and the second reflective layers 122 alternatingly and repeatedly formed in about 20 to 60 cycles.

The first reflective layer 121 and the second reflective layer 122 may form a reflection pair 125. The reflective layer 120 may include about 20 to 60 reflection pairs 125. However, it should be understood that more or fewer reflection pairs 125 may be used as needed.

For example, the reflective layer 120 may include a molybdenum (Mo)/silicon (Si) periodic multilayer, a Mo compound/Si compound periodic multilayer, a ruthenium (Ru)/Si periodic multilayer, a beryllium (Be)/Mo periodic multilayer, a Si/niobium (Nb) periodic multilayer, a Si/Mo/Ru periodic multilayer, a Si/Mo/Ru/Mo periodic multilayer, or a Si/Ru/Mo/Ru periodic multilayer.

The material of the reflective layer 120 and the thickness of each reflective layer 120 may be adjusted according to the wavelength band or range of the applied EUV light and/or the reflectivity of the EUV light required in the reflective layer 120.

In the EUV mask blank 100 according to some embodiments of the present disclosure, the reflective layer 120 is described as including a molybdenum (Mo)/silicon (Si) periodic multilayer. For example, the first reflective layer 121 may be formed of molybdenum, and the second reflective layer 122 may be formed of silicon. Alternatively, the first reflective layer 121 may be formed of silicon and the second reflective layer 122 may be formed of molybdenum.

Although it has been illustrated in FIG. 1 that the number of the first reflective layers 121 included in the reflective layer 120 is the same as the number of the second reflective layers 122 included in the reflective layer 120, the present disclosure is not limited thereto. In the reflective layer 120, a difference between the number of the first reflective layers and the number of the second reflective layers 122 may be one. That is, there may be one or more of the first reflective layers 121 than the second reflective layers 122 in the stack 120, or vice versa.

The reflective layer 120 may be formed using DC sputtering, RF sputtering, ion beam sputtering, or the like, but the present disclosure is not limited thereto. For example, in the case of forming a Mo/Si periodic multilayer by ion beam sputtering, a Si film and a Mo film may be alternately formed through a cycle in which a Si film is deposited by using a Si target as a target and an Ar gas as a sputter gas, and a Mo film is deposited by using a Mo target as a target and an Ar gas as a sputter gas.

The hydrogen absorber layer 130 may be formed on the reflective layer 120. The hydrogen absorber layer 130 serves or includes a material that is configured to absorb hydrogen ions (H+) flowing from the outside of a photomask 200 (see FIG. 6) or hydrogen atoms obtained by reducing hydrogen ions (H+), and to store them in the hydrogen absorber layer 130.

The hydrogen absorber layer 130 may store the absorbed hydrogen in a lattice structure. The hydrogen in the lattice structure may be located at an interstitial site rather than at a lattice site of the lattice structure.

The hydrogen absorber layer 130 may include a material having a relatively high hydrogen solubility.

When the hydrogen absorber layer 130 includes metal, the hydrogen absorber layer 130 may include metal having a small change in enthalpy when hydrogen is absorbed in the metal. The hydrogen absorber layer 130 may include metal in which a change in enthalpy of a hydrogen dissolution reaction is ±0.5 (eV/absorbed hydrogen) or less. The hydrogen absorber layer 130 may include at least one of titanium (Ti), vanadium (V), manganese (Mn), iron (Fe), cobalt (Co), nickel (Ni), copper (Cu), zirconium (Zr), molybdenum (Mo), palladium (Pd), hafnium (Hf), tantalum (Ta), rhodium (Rh), gold (Au), potassium (K), or cesium (Cs). The metal that may be included in the hydrogen absorber layer 130 may be transition metal or typical metal.

As one example, the hydrogen absorber layer 130 may be a single or monolithic film made of one of titanium (Ti), vanadium (V), manganese (Mn), iron (Fe), cobalt (Co), nickel (Ni), copper (Cu), zirconium (Zr), molybdenum (Mo), palladium (Pd), hafnium (Hf), tantalum (Ta), rhodium (Rh), gold (Au), potassium (K) or cesium (Cs). As another example, the hydrogen absorber layer 130 may be a multi-metal film including a first metal layer and a second metal layer made of different metals.

When the hydrogen absorber layer 130 includes a metal alloy, the hydrogen absorber layer 130 may include an alloy containing titanium (Ti). For example, the hydrogen absorber layer 130 may include an alloy having a body-centered cubic structure. The hydrogen absorber layer 130 may include one of a Ti—Fe based alloy, a Ti—Mn based alloy, a Ti—Cr based alloy, or a Ti—Fe—V based alloy.

The hydrogen absorber layer 130 may include a ceramic material, for example, a film made of boron carbide ($B_4C$).

The hydrogen absorber layer 130 may be formed using, for example, DC sputtering, RF sputtering, ion beam sputtering, or the like, but the present disclosure is not limited thereto.

In some embodiments, the hydrogen absorber layer 130 may have a thickness of, for example, 5 to 100 Å.

In an extreme ultraviolet mask blank according to some embodiments of the present disclosure, the hydrogen absorber layer 130 may be in contact with the reflective layer 120 located therebelow. Herein, the term "contact" may mean that there is no film interposed between the hydrogen absorber layer 130 and the reflective layer 120. In contrast, when an element is referred to as being "on" or "adjacent" another element (e.g., a layer or substrate), it may contact the other element, or intervening elements may also be present. Also, spatially relative terms, such as "beneath," "below," "lower," "above," "upper" "higher," and the like, are intended to encompass different orientations of the device in use or operation in addition to the orientation depicted in the figures.

Effects of the hydrogen absorber layer 130 will be described later with reference to FIGS. 6 to 7B.

The capping layer 140 may be disposed on the hydrogen absorber layer 130. The capping layer 140 may be in contact with the hydrogen absorber layer 130. The hydrogen absorber layer 130 may be disposed between the capping layer 140 and the reflective layer 120.

The capping layer 140 may serve to protect the reflective layer from mechanical damage and/or chemical damage.

The capping layer 140 may be made of ruthenium (Ru) or a ruthenium compound. The capping layer 140 may be a ruthenium film or a ruthenium compound film. The ruthenium compound may be formed of ruthenium (Ru) and Nb, Zr, Mo, Y, B, or La, or combinations thereof. The capping layer 140 may have a thickness of 5 to 100 Å.

The light absorber layer 150 may be disposed on the capping layer 140. The light absorber layer 150 may be made of a material having a relatively low reflectivity of extreme ultraviolet light while absorbing extreme ultraviolet light. The light absorber layer 150 may be made of a material having a desired chemical resistance. In addition, the light absorber layer 150 may be made of a material which can be removed by etching or the like.

The light absorber layer 150 may be made of a material containing Ta as a main component. In some embodiments, the light absorber layer 150 may include tantalum (Ta) as a main component and at least one element selected from hafnium (Hf), silicon (Si), zirconium (Zr), germanium (Ge), boron (B), nitrogen (N) or hydrogen (H). For example, the light absorber layer 150 may be formed of TaN, TaHf, TaHfN, TaBSi, TaBSiN, TaB, TaBN, TaSi, TaSiN, TaGe, TaGeN, TaZr, TaZrN, or combinations thereof.

The conductive coating film 160 may be disposed on the second surface 110b of the mask substrate 110. The conductive coating film 160 may be used to fix the photomask 200 (see FIG. 6) manufactured using an extreme ultraviolet mask blank to an electrostatic chuck of a lithography apparatus during a photolithography process.

The conductive coating film 160 may include a material containing tantalum (Ta) or a material containing chromium (Cr) having conductivity. For example, the conductive coating film 160 may be formed of at least one of Cr, CrN, or TaB.

Alternatively, the conductive coating film 160 may include metal oxide or metal nitride having conductivity. For example, the conductive coating film 160 may include at least one of titanium nitride (TiN), zirconium nitride (ZrN), hafnium nitride (HfN), ruthenium oxide ($RuO_2$), zinc oxide ($ZnO_2$), or iridium oxide ($IrO_2$).

Figure 2:
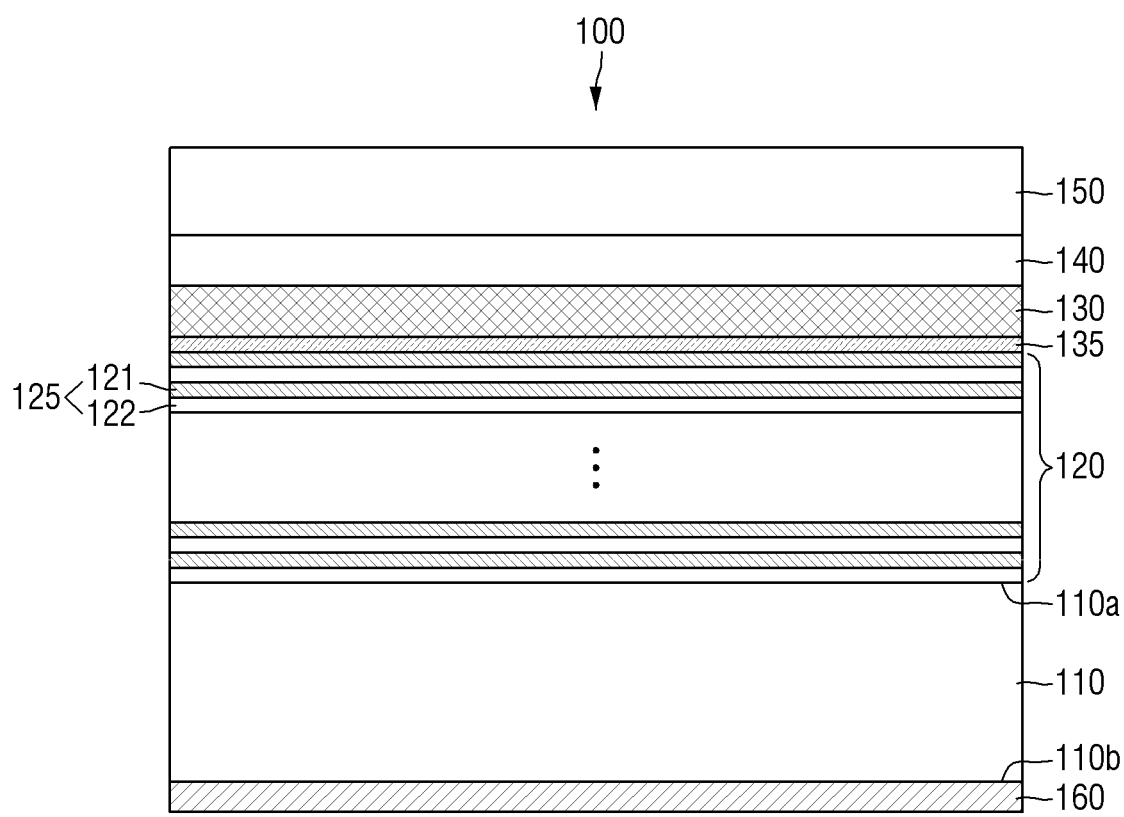
FIG. 2 is a diagram illustrating an EUV mask blank according to some embodiments of the present disclosure.

FIG. 2 is a diagram illustrating an EUV mask blank according to some embodiments of the present disclosure. For simplicity of description, a description will be made focusing on differences from FIG. 1.

Referring to FIG. 2, the EUV mask blank 100 according to some embodiments of the present disclosure may further include an interfacial silicide layer 135.

The interfacial silicide layer 135 may be interposed between the reflective layer 120 and the hydrogen absorber layer 130. The interfacial silicide layer 135 may include a silicide material.

For example, the interfacial silicide layer 135 may include a material obtained by siliciding the metal included in the hydrogen absorber layer 130. In one example, if the hydrogen absorber layer 130 includes metal (M), the interfacial silicide layer 135 may include M-Si with the silicided metal (M). In another example, when the hydrogen absorber layer 130 includes transition metal, the interfacial silicide layer 135 may include a material obtained by siliciding the transition metal.

Figure 3:
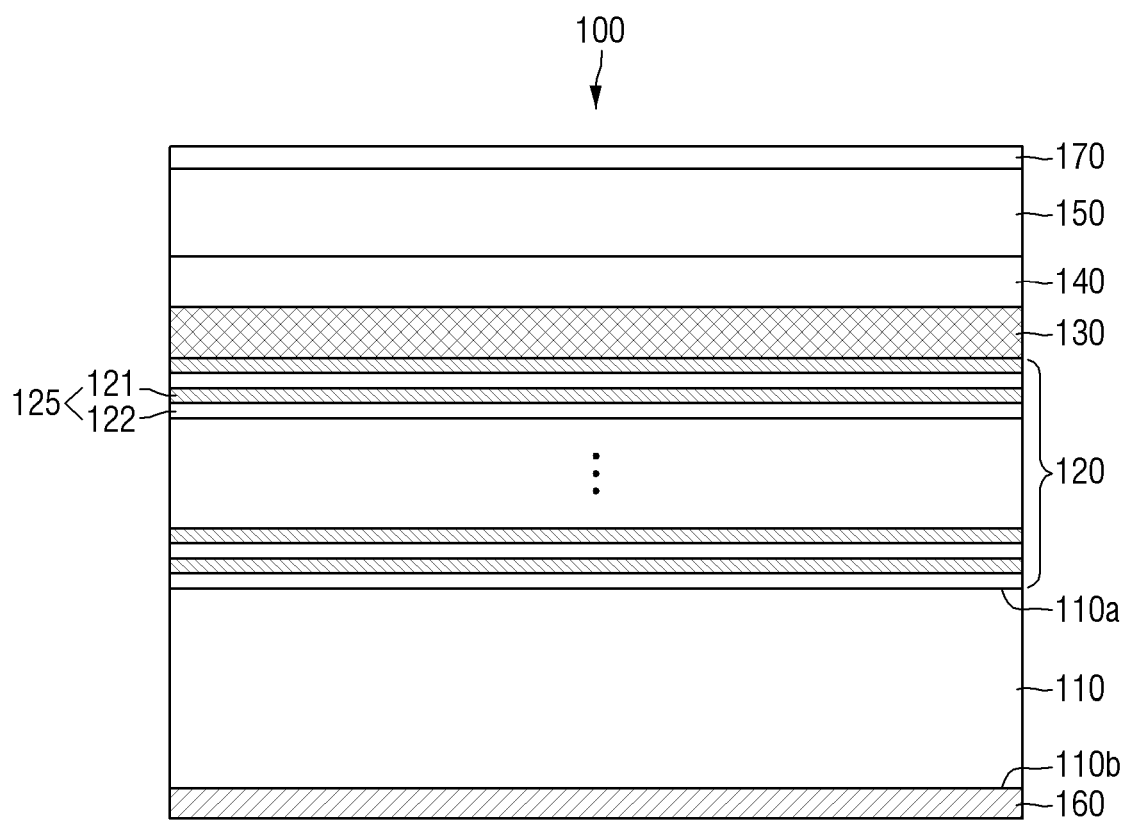
FIG. 3 is a diagram illustrating an EUV mask blank according to some embodiments of the present disclosure.

FIG. 3 is a diagram illustrating an EUV mask blank according to some embodiments of the present disclosure. For simplicity of description, a description will be made focusing on differences from FIG. 1.

Referring to FIG. 3, the EUV mask blank 100 according to some embodiments of the present disclosure may further include a low reflectivity layer, referred to herein as a low reflective layer 170.

The low reflective layer 170 may be disposed on the light absorber layer 150. The low reflective layer 170 may provide a relatively low reflectivity in a wavelength band of the inspection light, for example, a wavelength band of about 190 to 260 nm, during the inspection of pattern elements formed in the photomask 200 (see FIG. 6) manufactured using the EUV mask blank 100. Accordingly, the reflective layer 120 may serve to obtain a sufficient contrast.

The low reflective layer 170 may be made of at least one of, for example, TaBO, TaBNO, TaOH, or TaONH. The low reflective layer 170 may be formed by a sputtering process, but the present disclosure is not limited thereto.

Figure 4:
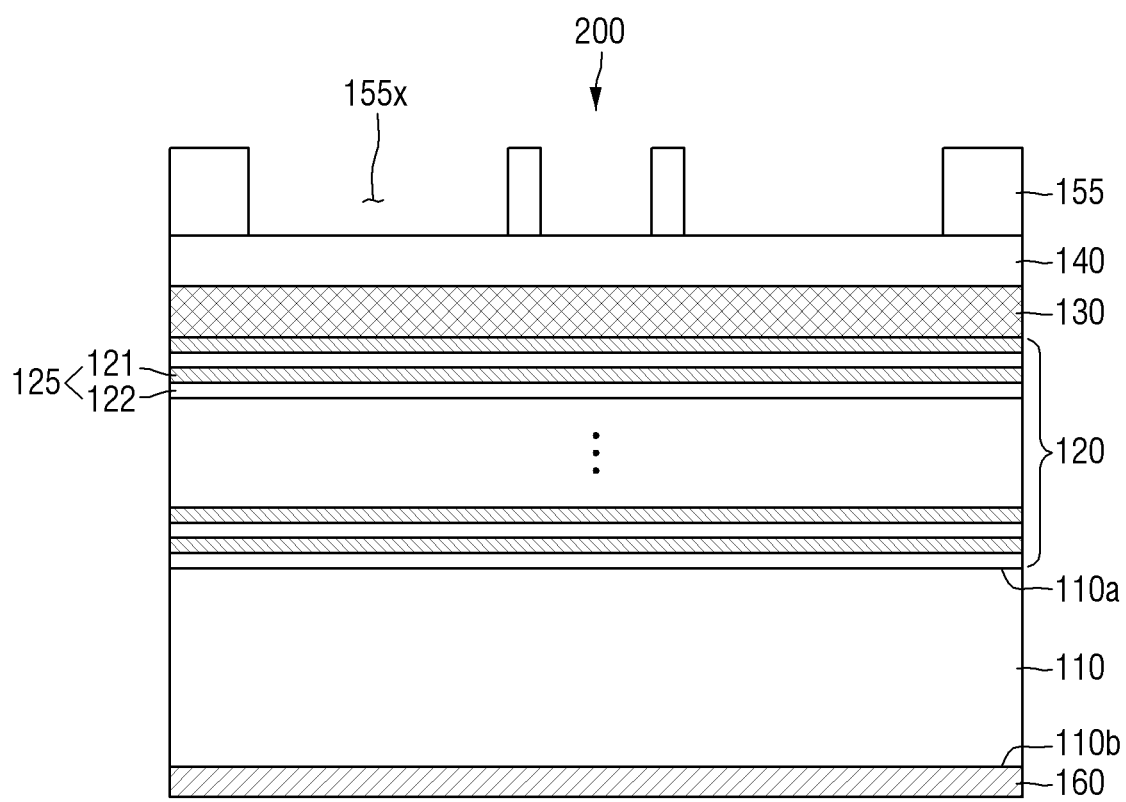
FIG. 4 is a diagram illustrating a photomask according to some embodiments of the present disclosure.
Figure 5:
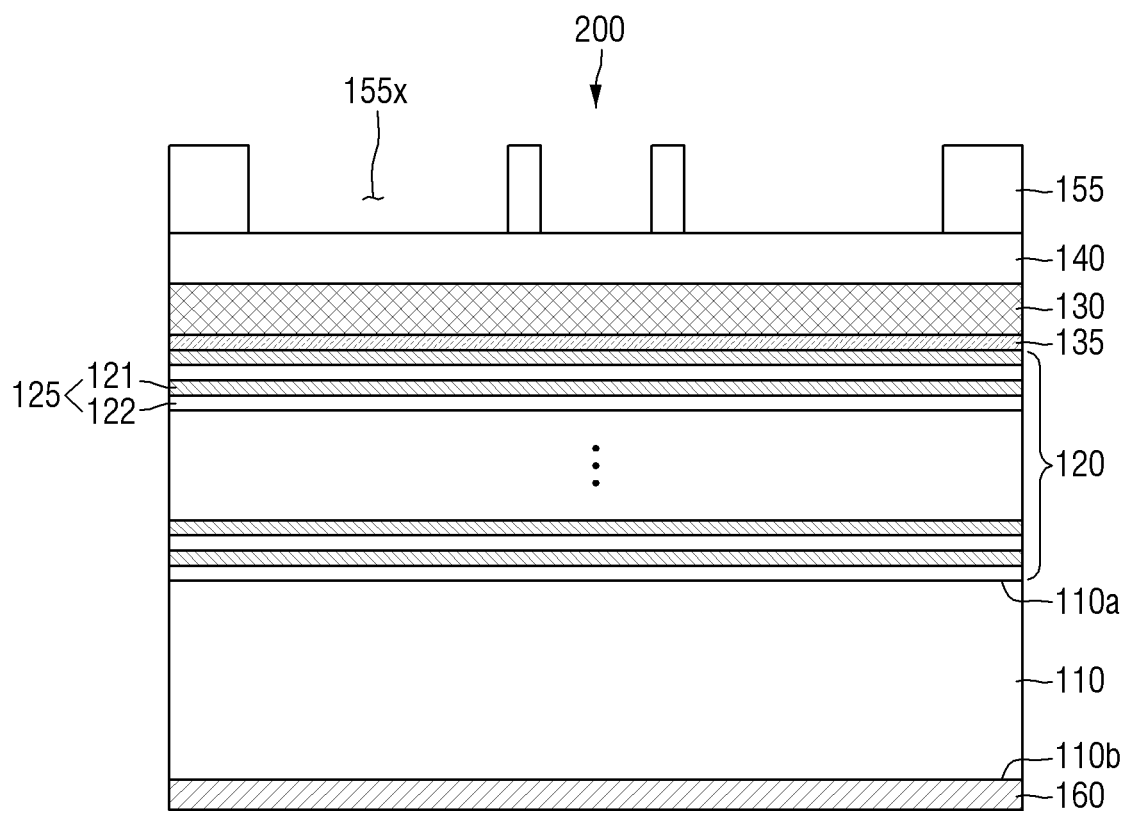
FIG. 5 is a diagram illustrating a photomask according to some embodiments of the present disclosure.

FIG. 4 is a diagram illustrating a photomask according to some embodiments of the present disclosure. FIG. 5 is a diagram illustrating a photomask according to some embodiments of the present disclosure.

The photomask 200 according to some embodiments of the present disclosure may be a reflective photomask that can be used in a photolithographic process using an EUV wavelength range, for example, an exposure wavelength of about 13.5 nm.

Further, the photomask 200 according to some embodiments of the present disclosure may be manufactured by patterning the light absorber layer 150 and/or the low reflective layer 120 included in the EUV mask blank 100 of FIGS. 1 to 3. For example, the photomask of FIG. 4 may be manufactured by patterning the light absorber layer 150 of FIG. 1, and the photomask of FIG. 5 may be manufactured by patterning the light absorber layer 150 of FIG. 2.

In the photomask 200 according to some embodiments of the present disclosure, since the mask substrate 110, the reflective layer 120, the hydrogen absorber layer 130, the capping layer 140 and the conductive coating film 160 are substantially similar to those described with reference to FIGS. 1 to 3, further description thereof will be omitted.

Referring to FIGS. 4 and 5, the photomask 200 according to some embodiments of the present disclosure may include the mask substrate 110, the reflective layer 120, the hydrogen absorber layer 130, the capping layer 140, the conductive coating film 160 and a light absorption pattern 155.

The light absorption pattern 155 may be disposed on the capping layer 140. The light absorption pattern 155 may include an opening 155x for passing extreme ultraviolet light therethrough.

In FIG. 4, the reflective layer 120 may be in contact with the hydrogen absorber layer 130.

In FIG. 5, the interfacial silicide layer 135 may be interposed between the reflective layer 120 and the hydrogen absorber layer 130.

Although not shown, it is needless to say that in FIGS. 4 and 5, a low reflective layer pattern in which the low reflective layer 170 (see FIG. 3) is patterned may be further formed on the light absorption pattern 155.

Figure 6:
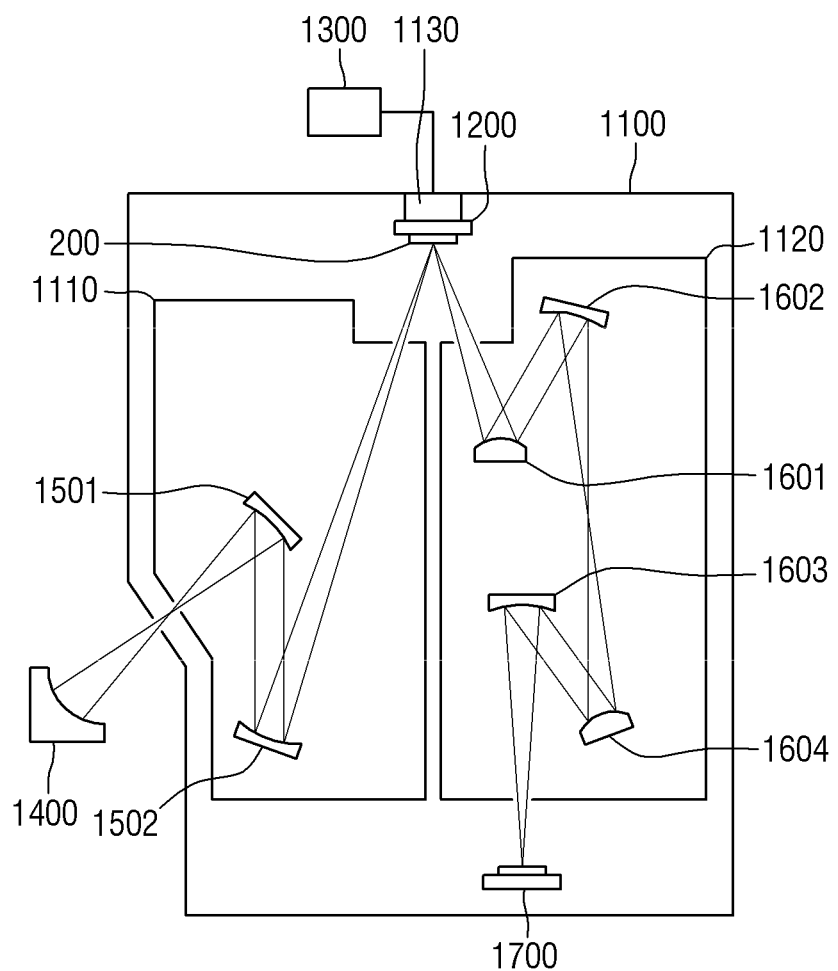
FIG. 6 schematically illustrates a lithography apparatus according to some embodiments of the present disclosure.

FIG. 6 schematically illustrates a lithography apparatus according to some embodiments of the present disclosure.

The lithography apparatus according to some embodiments of the present disclosure may be an apparatus used in a photolithography process using extreme ultraviolet light at an exposure wavelength.

The lithography apparatus according to some embodiments of the present disclosure may be an apparatus using the photomask of FIGS. 4 and 5.

In the lithography apparatus according to some embodiments of the present disclosure, the photomask 200 is substantially similar to that described with reference to FIGS. 1 to 5, and further description thereof will be omitted.

Referring to FIG. 6, a lithography apparatus according to some embodiments of the present disclosure may include a main chamber 1100, a first sub-chamber 1110, a second sub-chamber 1120, a reticle stage module 1130 (including a reticle stage 1200), a reticle stage power supply 1300, a source 1400 configured to provide exposure light, reflection mirrors 1501 and 1502 for an illumination system, reflection mirrors 1601, 1602, 1603 and 1604 for a projection optical system and a wafer stage 1700.

The main chamber 1100 includes the first sub-chamber 1110, the second sub-chamber 1120, the reticle stage module 1130, the illumination system reflection mirrors 1501 and 1502, the projection optical system reflection mirrors 1601, 1602, 1603 and 1604 and the wafer stage 1700. The inside of the main chamber 1100 may be maintained in a vacuum state.

The first sub-chamber 1110 may be located in the main chamber 1100. At least one of the illumination system reflection mirrors 1501 and 1502 may be disposed in the first sub-chamber 1110.

The exposure light from the source 1400, having passed through the first sub-chamber 1110 after being reflected by the illumination system reflection mirrors 1501 and 1502, may reach the photomask 200 fixed to the reticle stage 1200. In order to increase the reflection efficiency of the exposure light, the inside of the first sub-chamber 1110 may be maintained in a vacuum state.

The second sub-chamber 1120 may be located in the main chamber 1100. At least one of the projection optical system reflection mirrors 1601, 1602, 1603 and 1604 may be disposed in the second sub-chamber 1120.

The exposure light reflected from the surface of the photomask 200 may be reflected by the projection optical system reflecting mirrors 1601, 1602, 1603 and 1604 and irradiated onto the wafer on the wafer stage 1700. In order to increase the reflection efficiency of the exposure light, the inside of the second sub-chamber 1120 may be maintained in a vacuum state.

The reticle stage module 1130 may be located in the main chamber 1100 to be spaced apart from the first sub-chamber 1110 and the second sub-chamber 1120. The reticle stage module 1130 may include the reticle stage 1200, the photomask 200 and the like.

The reticle stage 1200 may be located in an upper portion of the main chamber 1100. The photomask 200 may be fixed on the reticle stage 1200. The reticle stage 1200 may be operable to perform a scanning operation.

The photomask 200 reflects the exposure light having passed through the first sub-chamber 1110 toward the second sub-chamber 1120.

The reticle stage power supply 1300 may be electrically connected to the photomask 200 and the reticle stage 1200. The reticle stage power supply 1300 is connected to the reticle stage 1200 and the photomask 200 so that an electrostatic force is generated between the reticle stage 1200 and the photomask 200. Accordingly, the photomask 200 can be fixed to the reticle stage 1200 by the electrostatic force.

The source 1400 may be located outside the main chamber 1100. The source 1400 may provide the exposure light used in the photolithography process. The source 1400 may irradiate the exposure light onto the illumination system reflection mirrors 1501 and 1502 in the first sub-chamber 1110.

The source 1400 may be, but is not limited to, a discharge produced plasma (DPP) EUV light source, a laser produced plasma (LPP) EUV light source, a hybrid EUV light source, a synchrotron EUV light source or the like.

The reflection mirrors 1501, 1502, 1601, 1602, 1603 and 1604 may be located in the first sub-chamber 1110 and the second sub-chamber 1120. One or more of the reflection mirrors 1501, 1502, 1601, 1602, 1603 and 1604 may be formed of an oblique incident mirror in which the exposure light irradiated from the source 1400 is incident on the reflection surface of the mirror at an oblique incident angle, or a multilayer mirror in which the reflective surface is a multilayer.

In order to transfer a fine pattern onto the wafer, the projection optical system reflection mirrors 1601, 1602, 1603 and 1604 may have high resolution. The number of the reflection mirrors 1501, 1502, 1601, 1602, 1603 and 1604 may be, for example, six, but is not limited thereto.

The wafer stage 1700 may be located in a lower portion of the main chamber 1100. The wafer can be fixed on or otherwise supported by the wafer stage 1700.

The wafer stage 1700 may be movable for micro-alignment. In addition, the wafer stage 1700 may be movable in a particular direction for the photolithography process.

Figure 7A:
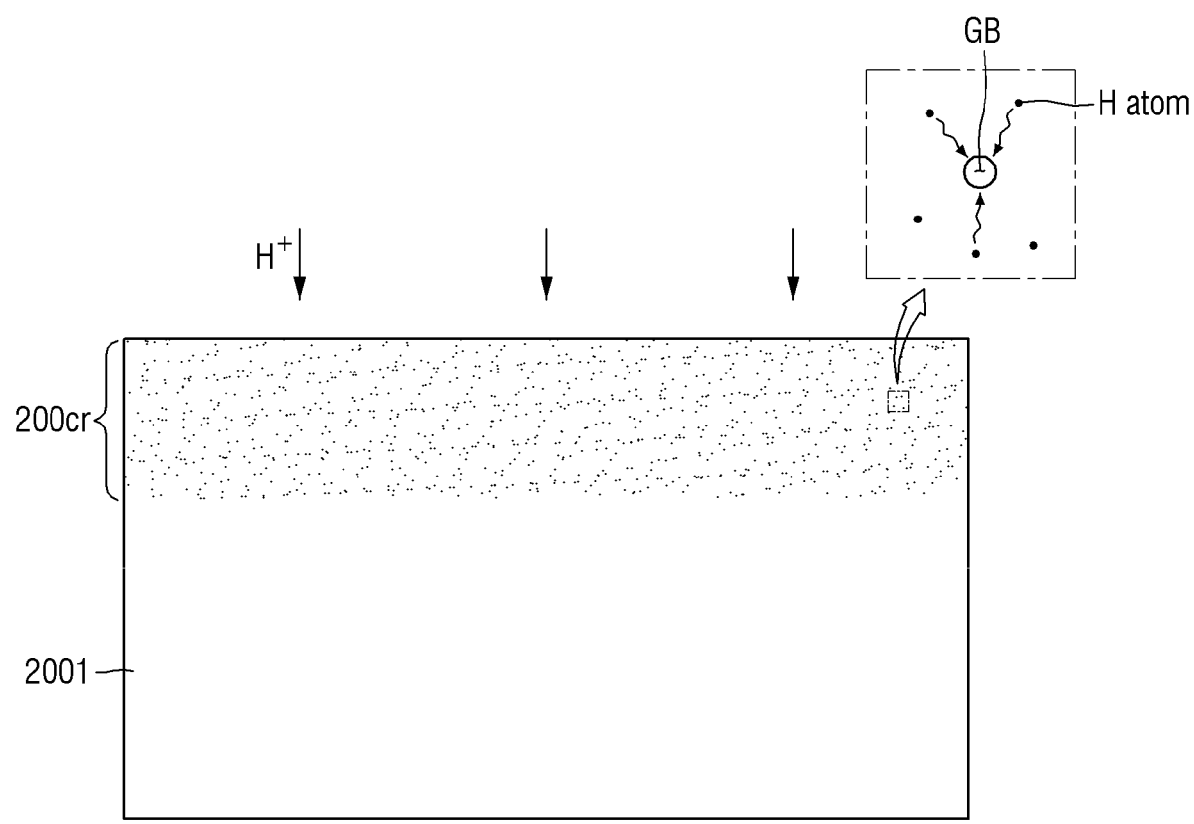
FIGS. 7A and 7B are diagrams for explaining problems of a comparative photomask and effects of a hydrogen absorber layer of the photomask according to some embodiments of the present disclosure.
Figure 7B:
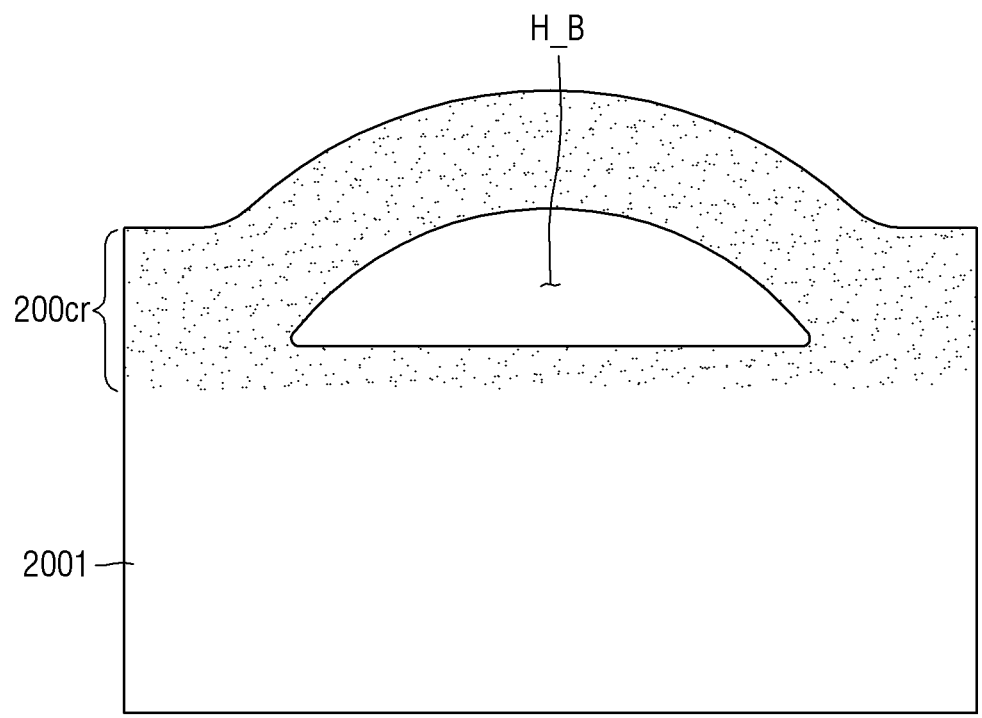

FIGS. 7A and 7B are diagrams of a comparative photomask 2001 for explaining effects of the hydrogen absorber layer of the photomasks according to embodiments of the present disclosure. For simplicity of description, FIGS. 7A and 7B do not show individual components included in a comparative photomask 2001.

In FIGS. 6 and 7A, there is a hydrogen ($H_2$) flow inside the lithography apparatus in order to transmit extreme ultraviolet light and to reduce or prevent contamination of the collector. Since the lithography apparatus is placed in a hydrogen atmosphere, hydrogen ions ($H^+$) may be generated by extreme ultraviolet light generated in the source 1400.

The generated hydrogen ions ($H^+$) may penetrate into the comparative photomask 2001 while moving in the lithography apparatus. The penetrated hydrogen ions ($H^+$) may be reduced to hydrogen atoms by obtaining secondary electrons generated in a photolithography process using extreme ultraviolet light.

By the penetrated hydrogen ions ($H^+$) and the reduced hydrogen atoms, a high concentration hydrogen region 200cr may be formed in the comparative photomask 2001. When the hydrogen atoms (H atoms) in the high concentration hydrogen region 200cr meet, hydrogen gas bubbles GB may be generated in the high concentration hydrogen region 200cr.

In FIG. 7B, the hydrogen gas bubbles GB in the high concentration hydrogen region 200cr may be accumulated in the high concentration hydrogen region 200cr in a gaseous state. Due to the accumulation of the hydrogen gas bubbles GB, a hydrogen blister H_B may be generated in the comparative photomask 2001.

The hydrogen blister H_B in the comparative photomask 2001 may make the comparative photomask 2001 unusable, thereby lowering the reliability of the photolithography process. Further, since the comparative photomask 2001 has to be made again, the process cost may be increased.

However, the photomask 200 according to some embodiments of the present disclosure includes the distinct hydrogen absorber layer 130 that is capable of storing (or otherwise comprises material(s) configured to store) hydrogen. The hydrogen reduced in the photomask 200 may be trapped or dissolved in the lattice of the hydrogen absorber layer 130.

When hydrogen is dissolved in the hydrogen absorber layer 130, hydrogen in the photomask 200 can be prevented or suppressed from being released in a gaseous state. Accordingly, the hydrogen absorber layer 130 can suppress the generation of a hydrogen blister in the photomask 200.

Therefore, the lifetime of the photomask 200 including the hydrogen absorber layer 130 can be increased, thereby reducing the cost for manufacturing the photomask 200 and the like.

FIGS. 8 to 11 are diagrams illustrating intermediate steps of methods of fabricating a semiconductor device according to some embodiments of the present disclosure.

The semiconductor device fabricating methods according to some embodiments of the present disclosure may be a fabricating method using the photomask of FIGS. 4 and 5.

Figure 8:
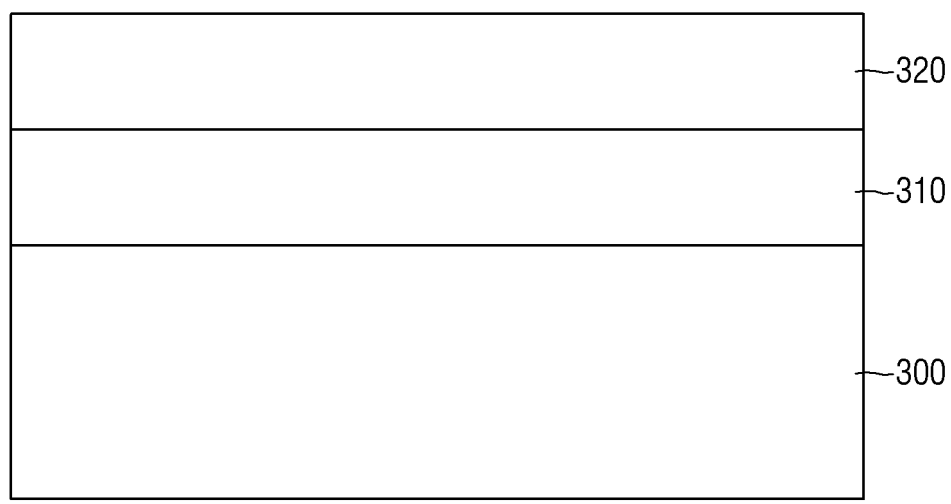
FIGS. 8 to 11 are diagrams illustrating intermediate steps of a method of fabricating a semiconductor device according to some embodiments of the present disclosure.

Referring to FIG. 8, a mask film 310 may be formed on a substrate 300.

The substrate 300 may be a silicon substrate, or may include other materials such as silicon-on-insulator (SOI), silicon germanium, silicon germanium on insulator (SGOI), indium antimonide, lead tellurium compound, indium arsenide, indium phosphide, gallium arsenide or gallium antimonide, but the present disclosure is not limited thereto.

The substrate 300 may include a circuit element including a conductive pattern and a semiconductor pattern. The substrate 300 may include an insulating film and a metal wiring in the insulating film.

When the substrate 300 includes a circuit element, the circuit element may be, for example, a fin-type transistor (FinFET) including a channel region having a fin-shaped pattern, a tunneling FET, a transistor including a nanowire, a transistor including a nanosheet, or a three-dimensional (3D) transistor, a bipolar junction transistor, a lateral double-diffused MOS transistor (LDMOS), or a planar transistor, but is not limited thereto.

The mask film 310 may include at least one of an insulating material, a semiconductor material, or a conductive material.

A photosensitive film 320 may be formed on the mask film 310.

Figure 9:
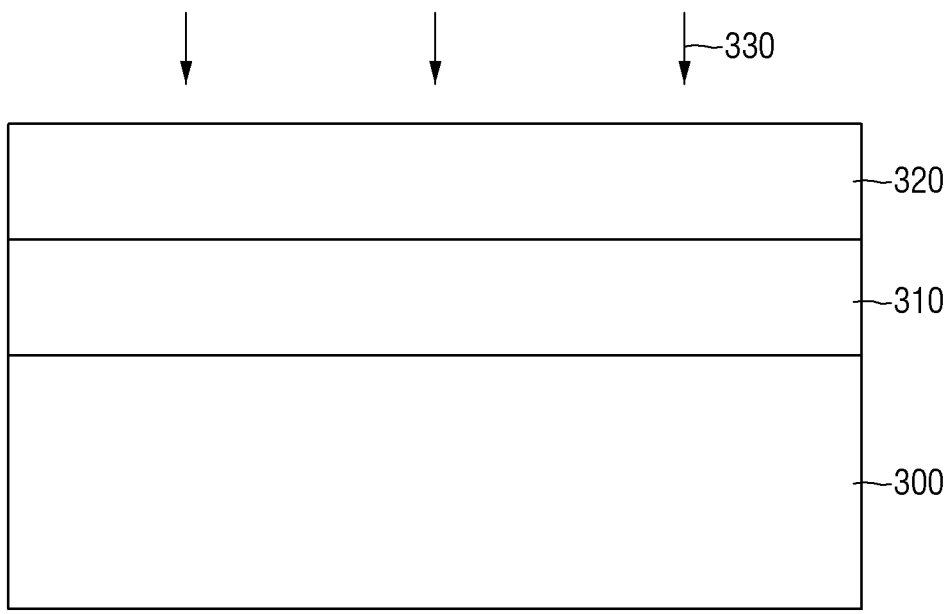
Figure 10:
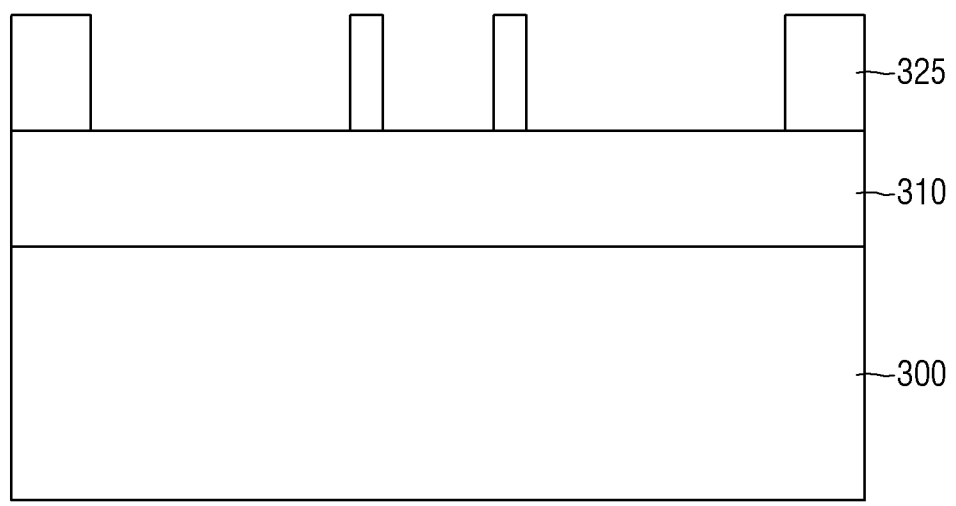
Figure 11:
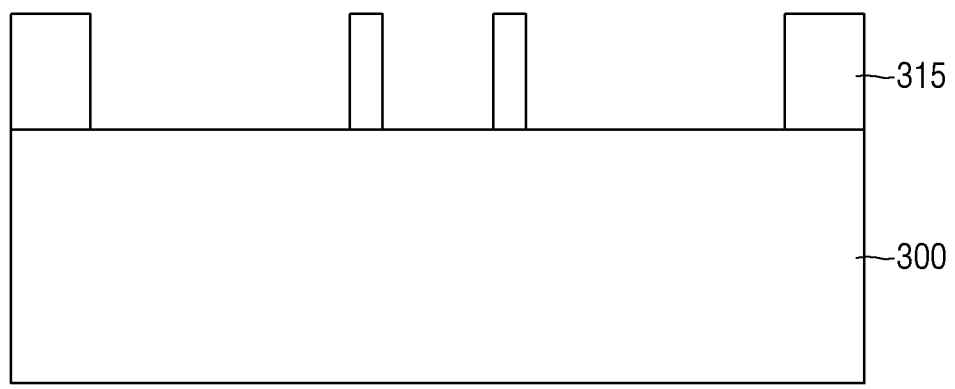

Referring to FIGS. 9 to 11, the mask film 310 may be etched using a photolithography process 330 using the photomask 200 (see FIG. 6). Accordingly, a mask pattern 315 may be formed on the substrate 300.

In FIG. 9, a device pattern may be transferred to the photosensitive film 320 by using the photolithography process 330. The photolithography process 330 may use the exposure light reflected from the photomask 200.

In FIG. 10, the device pattern transferred to the photosensitive film 320 may be developed to form a photosensitive pattern 325 on the mask film 310.

In FIG. 11, the mask film 310 may be etched using the photosensitive pattern 325. Accordingly, a mask pattern 315 may be formed on the substrate 300. The photosensitive pattern 325 may be removed.

As an example, a part of the substrate 300 may be etched using the mask pattern 315. As another example, the mask pattern 315 itself may be used as a part of the semiconductor device.

Although some embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. An extreme ultraviolet (EUV) mask blank comprising:
   a substrate comprising a first surface;
   a reflective layer comprising first reflective layers and second reflective layers alternately stacked on the first surface of the substrate;
   a capping layer on the reflective layer; and
   a hydrogen absorber layer between the reflective layer and the capping layer, the hydrogen absorber layer comprising a material having a lattice structure that is configured to dissolve hydrogen therein and being in contact with the capping layer.

2. The EUV mask blank of claim 1, wherein the hydrogen absorber layer comprises at least one of titanium (Ti), vanadium (V), manganese (Mn), iron (Fe), cobalt (Co), nickel (Ni), copper (Cu), zirconium (Zr), molybdenum (Mo), palladium (Pd), hafnium (Hf), tantalum (Ta), rhodium (Rh), gold (Au), potassium (K), cesium (Cs), or boron carbide ($B_4C$).

3. The EUV mask blank of claim 2, wherein the hydrogen absorber layer includes metal in which a change in enthalpy of a hydrogen dissolution reaction is 0.5 (eV/absorbed hydrogen) or less.

4. The EUV mask blank of claim 1, wherein the lattice structure is a body-centered cubic structure, and wherein the hydrogen absorber layer comprises one of a Ti—Fe based alloy, a Ti—Mn based alloy, a Ti—Cr based alloy, or a Ti—Fe—V based alloy.

5. The EUV mask blank of claim 1, wherein the hydrogen absorber layer is in contact with the reflective layer.

6. The EUV mask blank of claim 1, further comprising an interfacial silicide layer along an interface between the hydrogen absorber layer and the reflective layer.

7. The EUV mask blank of claim 6, wherein the hydrogen absorber layer comprises metal (M), and the interfacial silicide layer comprises a silicide of the metal.

8. The EUV mask blank of claim 1, wherein the first reflective layers comprise silicon (Si), and the second reflective layers comprise molybdenum (Mo).

9. The EUV mask blank of claim 1, wherein the capping layer is a ruthenium (Ru) film or a ruthenium compound film.

10. The EUV mask blank of claim 1, further comprising a light absorber layer on the capping layer,
    wherein the light absorber layer comprises a material that is configured to absorb extreme ultraviolet light.

11. The EUV mask blank of claim 1, further comprising a conductive coating film on a second surface of the substrate that is opposite the first surface.

12. An extreme ultraviolet (EUV) mask blank comprising:
    a low thermal expansion material (LTEM) substrate comprising a first surface;
    a reflective layer comprising a molybdenum (Mo)/silicon (Si) multilayer on the first surface of the LTEM substrate;
    a first absorber layer on the reflective layer, the first absorber layer comprising at least one of vanadium (V), manganese (Mn), iron (Fe), zirconium (Zr), hafnium (Hf), tantalum (Ta), rhodium (Rh), gold (Au), potassium (K), cesium (Cs), or boron carbide ($B_4C$);
    a capping layer on the first absorber layer, the capping layer comprising ruthenium (Ru) or a ruthenium compound; and
    a second absorber layer on the capping layer opposite the first absorber layer.

13. The EUV mask blank of claim 12, wherein the capping layer is in contact with the first absorber layer.

14. The EUV mask blank of claim 12, wherein the first absorber layer is in contact with the reflective layer.

15. The EUV mask blank of claim 12, wherein the first absorber layer comprises a transition metal, and further comprising an interfacial silicide layer along an interface between the reflective layer and the first absorber layer,
    wherein the interfacial silicide layer comprises a silicide of the transition metal.

16. The EUV mask blank of claim 12, wherein the first absorber layer comprises a material having a lattice structure that is configured to store hydrogen at an interstitial site thereof, and the second absorber layer comprises a material that is configured to absorb extreme ultraviolet light.

17. A photomask comprising:
    a substrate comprising a first surface and a second surface opposed to each other;
    a reflective layer, comprising a molybdenum (Mo)/silicon (Si) multilayer, on the first surface of the substrate;
    a capping layer on the reflective layer;
    a hydrogen absorber layer between the reflective layer and the capping layer, the hydrogen absorber layer comprising hydrogen and being in contact with the capping layer;
    a light absorption pattern on the capping layer, the light absorption pattern comprising an opening for passing extreme ultraviolet light therethrough; and
    a conductive coating film on the second surface of the substrate.

18. The photomask of claim 17, wherein the hydrogen absorber layer comprises at least one of titanium (Ti), vanadium (V), manganese (Mn), iron (Fe), cobalt (Co), nickel (Ni), copper (Cu), zirconium (Zr), molybdenum (Mo), palladium (Pd), hafnium (Hf), tantalum (Ta), rhodium (Rh), gold (Au), potassium (K), cesium (Cs), or boron carbide ($B_4C$).

19. The photomask of claim 18, wherein the hydrogen absorber layer is in contact with the reflective layer and comprises a material having a lattice structure that is configured to dissolve hydrogen therein, and wherein a change in enthalpy of a hydrogen dissolution reaction in the hydrogen absorber layer is about 0.5 (eV/absorbed hydrogen) or less.

20. The photomask of claim 18, further comprising an interfacial silicide layer along an interface between the hydrogen absorber layer and the reflective layer.

* * * * *